United States Patent
Dhal et al.

(12)

(10) Patent No.: US 6,489,065 B1
(45) Date of Patent: Dec. 3, 2002

(54) HOLOGRAPHIC MEDIUM AND PROCESS FOR USE THEREOF

(75) Inventors: Pradeep K. Dhal, Acton; Eric S. Kolb, Ipswich; Richard A. Minns, Arlington, all of MA (US)

(73) Assignee: Polaroid Corporation, Cambridge, MA (US)

( * ) Notice: Subject to any disclaimer, the term of this patent is extended or adjusted under 35 U.S.C. 154(b) by 0 days.

(21) Appl. No.: 08/649,823

(22) Filed: May 17, 1996

(51) Int. Cl.⁷ .................................................. G03H 1/02
(52) U.S. Cl. .................................... 430/2; 430/1; 359/2
(58) Field of Search .............................. 522/25, 28, 31, 522/66; 430/1, 2, 290; 359/1, 3

(56) References Cited

U.S. PATENT DOCUMENTS

| | | | | |
|---|---|---|---|---|
| 4,959,284 A | * | 9/1990 | Smother et al. | 430/2 |
| 4,970,129 A | * | 11/1990 | Ingwall et al. | 430/1 |
| 5,055,439 A | * | 10/1991 | Allen et al. | 522/25 |
| 5,286,612 A | | 2/1994 | Telfer | 430/335 |
| 5,441,850 A | | 8/1995 | Marshall et al. | 430/336 |
| 5,453,345 A | | 9/1995 | Grasshoff et al. | 430/270 |
| 5,527,659 A | * | 6/1996 | Yamaoka et al. | 430/179 |

FOREIGN PATENT DOCUMENTS

| | | | | |
|---|---|---|---|---|
| EP | 0487086 | * | 5/1992 | 430/2 |
| EP | 517122 | | 5/1992 | |
| EP | 620501 | | 4/1994 | |
| EP | 697631 | | 2/1996 | |
| JP | 03-118591 | * | 5/1991 | |
| WO | WO 97/13183 | | 4/1997 | |

OTHER PUBLICATIONS

Patent Abstracts of Japan, Abstract 04–178,648, Published 6/92.

* cited by examiner

*Primary Examiner*—Martin Angebranndt

(57) ABSTRACT

A holographic recording medium comprises (a) an acid generator capable of generating an acid upon exposure to actinic radiation; and (b) a polymer comprising a plurality of high refractive index moieties, a plurality of low refractive index moieties, and a plurality of acid-sensitive linking groups connecting the high and low refractive index moieties. When an interference pattern is formed within this medium, in the light areas of this interference pattern acid is generated by the acid generator and cleaves the acid-sensitive linking groups, thereby causing separation of either the high or the low refractive index moieties from the polymer, and formation of a hologram within the medium.

2 Claims, 5 Drawing Sheets

HOLOGRAPHIC MEDIUM AND PROCESS FOR USE THEREOF

BACKGROUND OF THE INVENTION

This invention relates to a holographic medium and a process for the use thereof to form a hologram. More specifically, this invention relates to such a medium containing a polymer which separates into two components during the holographic exposure.

In prior art processes for the formation of volume-phase holograms, interference fringes are formed within a holographic recording medium comprising a homogeneous mixture of a polymerizable monomer or oligomer and a polymeric binder; the polymerizable monomer or oligomer must of course be sensitive or sensitized to the radiation used to form the interference fringes. In the light areas of the fringes, the monomer or oligomer undergoes polymerization to form a polymer that has a refractive index different from that of the binder. Diffusion of the monomer or oligomer into the light areas, with consequent chemical segregation of binder from these areas and its concentration in the dark areas, produces spatial separation between the polymer formed from the monomer or oligomer and the binder, thereby providing the refractive index modulation needed to form the hologram. Typically, after the holographic exposure, a post-treatment step of blanket exposure of the medium to actinic radiation is required to complete the polymerization of the monomer or oligomer and fix the hologram.

There are two major difficulties in formulating this type of holographic recording medium. Firstly, the components of the medium must be compatible with one another so that the medium does not separate into two discrete phases before the holographic exposure, and for a practical commercial product, it is necessary that the recording medium not undergo phase separation during several months of storage during which the medium may be subjected to wide temperature variations, for example in trucks during delivery of the medium. However, it is also desirable that the two phases produced from the medium during the holographic exposure show a large difference in refractive index, since such a large difference in refractive index improves the holographic efficiency of the hologram produced. Unfortunately, these requirements of compatibility and high refractive index difference tend to be inconsistent with one another. A high refractive index component will typically contain numerous aromatic nuclei, while a low refractive index component will typically contain fluorinated alkyl or similar groups, and such aromatic and fluorinated alkyl components tend not to form homogeneous mixtures. It is difficult to produce, for example, a recording medium, comprising a highly aromatic polymer and a perfluoroalkyl acrylate or methacrylate monomer or oligomer, which is homogeneous and stable for long periods over a wide temperature range. Although useful media can be formulated, the ranges of components which can be used are limited (which tends to increase the cost of the medium) and in practice workers are usually forced into somewhat unsatisfactory compromises, resulting in media which have workable (though less than optimum) compatibility and workable (though less than optimum) refractive index differences.

Secondly, the physical properties of such holographic recording media tend to be unsatisfactory. Since such media comprise a mixture of a polymeric binder and a polymerizable monomer or oligomer, they tend to be soft, or even semi-solid, with considerable tackiness. Such soft, tacky mixtures are difficult to handle without damage to the thin layer of the medium normally used to form a hologram, and are likely to pick up dirt, dust and other materials during storage and handling; the presence of dust, dirt etc. on the medium is of course highly undesirable since the quality of the resultant hologram is adversely affected.

The present invention provides a holographic recording medium which is essentially free from the problems of incompatibility and tackiness experienced in prior art media.

SUMMARY OF THE INVENTION

Accordingly, this invention provides a process for preparing a hologram. This process comprises:

providing a holographic recording medium comprising (a) an acid generator capable of generating an acid upon exposure to actinic radiation; and (b) a polymer, this polymer comprising a plurality of high refractive index moieties, a plurality of low refractive index moieties, and a plurality of acid-sensitive linking groups connecting the high and low refractive index moieties, the acid-sensitive linking groups being capable of being cleaved by the acid generated by the acid generator; and passing into the medium a reference beam of coherent actinic radiation to which the acid generator is sensitive and an object beam of the same coherent actinic radiation, thereby forming within the medium an interference pattern and, in the light areas of this interference pattern, causing generation of acid by the acid generator and cleavage of the acid-sensitive linking groups by this acid, thereby causing separation of either the high or the low refractive index moieties from the polymer, and formation of a hologram within the medium.

This invention also provides a holographic recording medium comprising:

(a) an acid generator capable of generating an acid upon exposure to actinic radiation; and (b) a polymer, this polymer comprising a plurality of high refractive index moieties, a plurality of low refractive index moieties, and a plurality of acid-sensitive linking groups connecting the high and low refractive index moieties, the acid-sensitive linking groups being capable of being cleaved by the acid generated by the acid generator, thereby causing separation of either the high or the low refractive index moieties from the polymer, the medium being capable, upon exposure to an interference pattern formed between two beams of the actinic radiation, of forming regions differing in refractive index and thereby producing a hologram.

BRIEF DESCRIPTION OF THE DRAWINGS

The accompanying drawings show the formulae of various specific preferred polymers for use in the processes and recording media of the present invention.

DETAILED DESCRIPTION OF THE INVENTION

Figure 1:
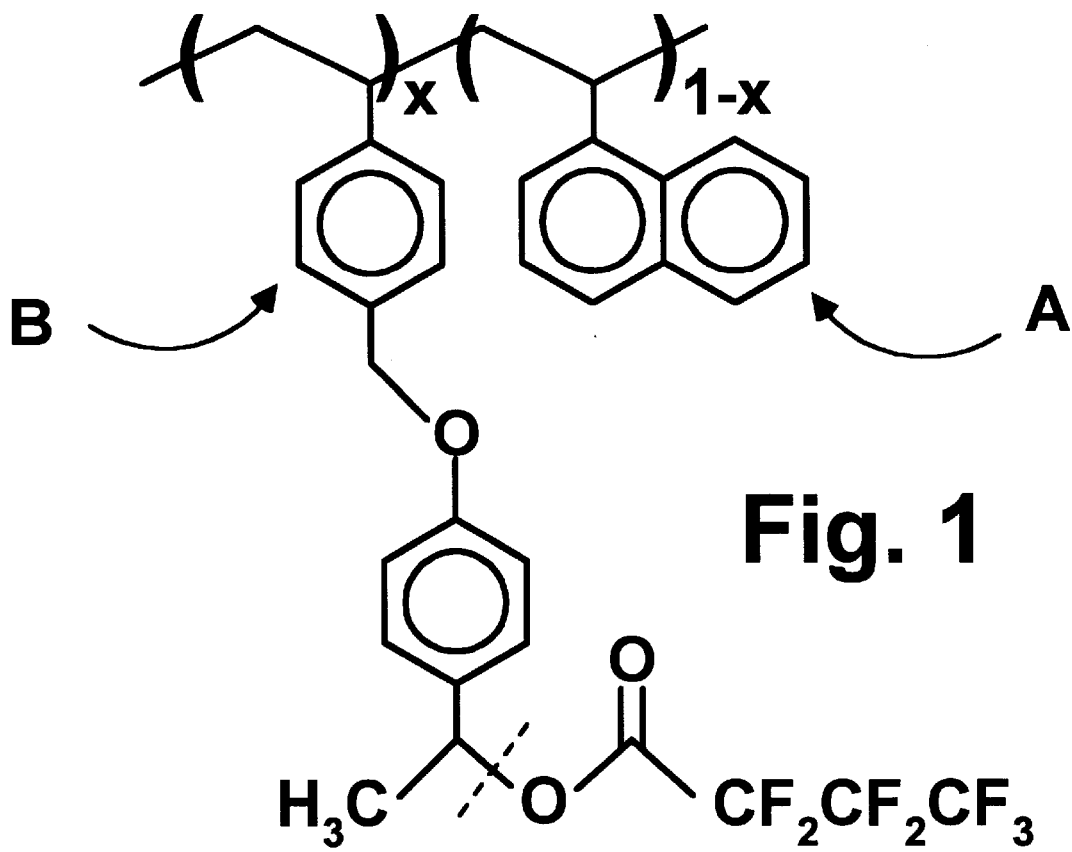

As already mentioned, the holographic recording medium of the present invention comprises an acid generator and a polymer. This polymer contains high and low refractive index moieties linked by acid-sensitive linking groups. Upon exposure of the medium to an interference pattern formed by actinic radiation, in the light areas of the pattern the acid generator generates an acid, which cleaves the acid-sensitive linking groups, thereby detaching either the high or the low refractive index moieties from the polymer, while leaving the other moieties still attached to the polymer. The liberated moieties will diffuse from the light areas of the pattern into the dark areas, thereby forming regions differing in refractive index. For example, if the cleavage of the linking groups in the polymer liberates the low refractive index moieties, these low refractive index moieties will diffuse from the light areas into the dark areas of the pattern, thus producing a surplus of low refractive index moieties in the dark areas and a deficiency of low refractive index moieties in the light areas. Consequently, after exposure to the interference pattern, the medium will have regions differing in refractive index, with the light areas having a higher refractive index than the dark areas, thereby forming a hologram within the medium.

Since the present holographic recording medium need comprise only a single polymer and an acid generator, it does not suffer from the compatibility problems which plague prior art media containing a binder and a monomer or oligomer which differs significantly from the binder in refractive index; obviously, the high and low refractive index moieties even if completely different in chemical nature, cannot phase separate while covalently bonded to each other within a single polymer. Similarly, since the holographic medium is free from polymerizable monomers and oligomers, it can be made non-tacky, and is thus easy to handle and free from the problems caused by dust, dirt etc. adhering to prior art holographic recording media.

The acid generator used in the present recording medium may be any acid generator which produces an acid upon exposure to the actinic radiation, provided of course that the acid generator is compatible with the polymer and any other materials present in the recording medium. The term "acid generator" is used herein to refer to the component or components of the medium that are responsible for the radiation-induced formation of acid. Thus, the acid generator may comprise only a single compound that produces acid directly. Alternatively, the acid generator may comprise an acid generating component which generates acid and one or more sensitizers which render the acid generating component sensitive to a particular wavelength of actinic radiation, as discussed in more detail below. The acid produced from the acid generator may be either a Bronsted acid or a Lewis acid, provided of course that the acid is of a type and strength which will induce cleavage of the acid-sensitive linkages present in the polymer. When the acid generator produces a Bronsted acid, this acid preferably has a $pK_a$ less than about 0. Known superacid precursors such as diazonium, sulfonium, phosphonium and iodonium salts may be used in the present medium, but iodonium salts are generally preferred. Diaryliodonium salts have been found to perform well in the present media, with a specific preferred diaryliodonium salt being (4-octyloxyphenyl) phenyliodonium hexafluoroantimonate. Triarylsulfonium salts have also given good results in the present process, a specific preferred material of this type being that sold under the tradename Cyracure UVI-6974 by Union Carbide Corporation, Danbury Conn. Among the Lewis acid generators, ferrocenium salts have been found to give good results in the present media, a specific preferred ferrocenium salt being cyclopentadienyl cumene iron(II) hexafluorophosphate, available commercially under the tradename Irgacure 261 from Ciba-Geigy Corporation, 7 Skyline Drive, Hawthorne N.Y. 10532–2188. This material has the advantage of being sensitive to 476 or 488 nm visible radiation without any sensitizer, and can be sensitized to other visible wavelengths.

In the absence of any sensitizer, iodonium salts are typically only sensitive to radiation in the far ultra-violet region, below about 300 nm, and the use of far ultra-violet radiation is inconvenient for the production of holograms because for a given level of performance ultra-violet lasers are substantially more expensive than visible lasers. However, it is well known that, by the addition of various sensitizers, iodonium salts can be made sensitive to various wavelengths of actinic radiation to which the salts are not substantially sensitive in the absence of the sensitizer. In particular, iodonium salts can be sensitized to visible radiation with sensitizers using certain aromatic hydrocarbons substituted with at least two alkynyl groups, specific preferred sensitizers of this type being 5,12-bis(phenylethynyl)-naphthacene and 9,10-bis(phenylethynyl)anthracene. The former renders iodonium salts sensitive to the 514 nm radiation from an argon ion laser, and to the 532 nm radiation from a frequency-doubled YAG laser, while the latter renders iodonium salts sensitive to 476 nm blue light from an argon laser; all of these lasers are convenient sources for the production of holograms. 5,12-Bis (phenylethynyl)naphthacene also sensitizes ferrocenium salts to the same wavelengths, and has the advantage that it is photobleachable, so that the visible absorption of the holographic medium decreases during the exposure, thus helping to produce a low minimum optical density ($D_{min}$) in the hologram.

The sensitivity of the holographic recording material may be increased by incorporating therein a secondary acid generator, as described in U.S. Pat. Nos. 5,453,345; 5,441,850 and 5,286,612. In such a recording medium, the secondary acid generator can be decomposed by the acid (called the "primary acid") formed by the acid generator; this decomposition of the secondary acid generator generates a secondary acid which can itself cause cleavage of the acid-sensitive linking groups. As described in detail in the aforementioned patents, a single mole of the primary acid can cause the generation of a considerable number of moles (typically about 20 moles) of secondary acid. The resulting "amplification" of the primary acid by the secondary acid generator results in a greatly increased concentration of acid in the medium during imaging, and hence increases the sensitivity of the medium.

The preferred type of polymer for use in the present medium comprises a main chain, and a plurality of side chains attached to the main chain; conveniently the main chain is a polymethylene or alkyl-substituted polymethylene, as produced by polymerization of monomers containing vinyl or methylvinyl groups, or a polysiloxane chain (polymers of this type may be prepared by hydrosilylation of a polyhydrosiloxane with the appropriate monomers). Each of the side chains comprises one of the acid-sensitive linking groups and at least one high or low refractive index moiety on the opposed side of the acid-sensitive linking group from the main chain. Upon cleavage of the acid-sensitive linking group, the high or low refractive index moiety in the side chain on the "outboard" side of the linking group will become detached from the main chain. In such a polymer, the low or high refractive index moieties which are not to be lost as a result of the cleavage of the linking group may be disposed within the main chain itself, in side chains which are different from those containing the moieties to be lost and which do not contain acid-sensitive linking groups, or within the side chains containing the moieties to be lost but between the main chain and the linking group, so that they are not lost when the linking group is cleaved. The polymers may contain more than one type of high and low refractive index moiety, and if such a case, the moieties which are not lost may occupy more than one of the aforementioned positions.

As already indicated, cleavage of the acid-sensitive linking groups in the polymer used in the present media may liberate either the high or the low refractive index moieties. However, in choosing the polymer to be used, consideration should be given to the diffusability of the moieties liberated by cleavage of the acid-sensitive linking groups, since the formation of regions of differing refractive index, and thus the efficiency of the final hologram, depends upon the diffusion of the liberated moieties from the light areas of the interference pattern into the dark areas. Thus, it is desirable that the liberated moieties be highly diffusible through the polymer used.

Those skilled in polymer technology will be aware of the types of moieties which increase or decrease the refractive indices of polymers, and thus will have no difficulty in selecting appropriate high and low refractive index moieties for inclusion in the polymers used in the present process and medium. Although other moieties may be used, in general the preferred high refractive index moieties are aromatic nuclei (for example, phenyl and naphthyl radicals), while preferred low refractive index moieties are alkyl and cycloalkyl groups, desirably bearing one or more fluorine substituents; perfluoroalkyl groups are especially preferred. Dialkylsiloxane groups are also very useful as low refractive index moieties in the present polymers.

Preferred acid-sensitive linking groups are ester (—C(=O)—O—) linkages which fragment to stable carbocations, oxalate (—O—C(=O)—C(=O)—O—) linkages being especially preferred. In some cases, it may be desirable to use a linking group which cleaves so as to generate a polymerizable group, for example a vinyl group. The resultant polymerizable group may be located either on the modified polymer remaining after the cleavage or on the moiety released by the cleavage. The polymerizable groups thus generated within the exposed holographic recording medium by cleavage of the linking groups can, after the holographic exposure, be subjected to conditions effective to cause polymerization of the polymerizable groups, thus cross-linking the modified polymer remaining, or polymerizing the released moiety, and in either case increasing the stability of the hologram.

Specific preferred polymers are illustrated in FIGS. 1–9 of the accompanying drawings. The polymer shown in FIG. 1 comprises a polymethylene main chain bearing two different types of side chains, generally designated A and B respectively. Side chain A comprises simply a α-naphthyl group, which serves as one of the high refractive index moieties of the polymer. Side chain B comprises, in sequence outward from the main chain (a) a 4-((4-ethylphenoxy)methyl)phenyl group, which serves as a second high refractive index moiety; (b) an ester linking group attached to the a-carbon atom of the ethyl group; and (c) a perfluoropropyl group attached to the carbonyl group of the ester linking group and serving as the low refractive index moiety of the polymer. As will be obvious to skilled chemists, upon treatment of this polymer with a strong acid, side chain A will not be affected, but the ester linkage in side chain B will be cleaved (as indicated by the broken line in FIG. 1) with the loss of the perfluoropropyl group (as perfluorobutyric acid) but with a 4-((4-vinylphenoxy)methyl)phenyl group being formed attached to the main chain. Thus, upon exposure of the polymer to acid, the low refractive index moieties will be lost, while both types of high refractive index moieties will remain attached to the main chain, thus producing a polymer of increased refractive index. Furthermore, because elimination of perfluorobutyric acid leaves vinyl groups (as p-alkoxystyrene groups) attached to the polymer remaining after the cleavage, this polymer may be crosslinked by subjecting these vinyl groups to cationic or free radical polymerization, thereby stabilizing the hologram produced.

In the polymer of FIG. 1, x is preferably less than 0.5 and is desirably about 0.2.

Figure 2:
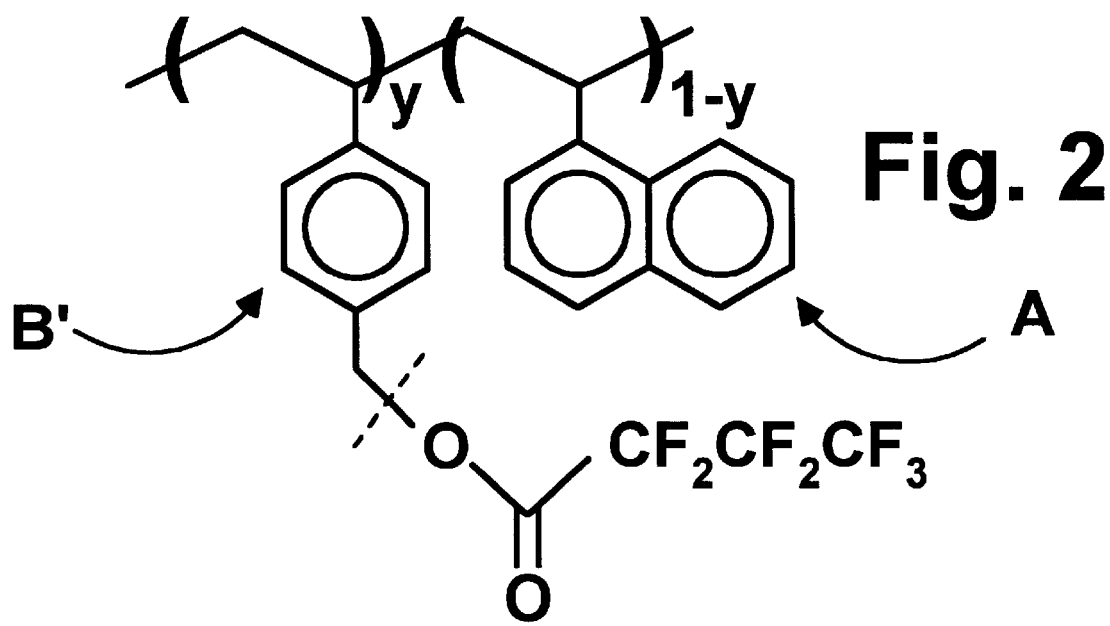

The polymer shown in FIG. 2 is very similar to that shown in FIG. 1 but the 4-((4-ethylphenoxy)methyl)phenyl group present in the polymer of FIG. 1 is replaced by a tolyl group to produce a side chain generally designated B'. Upon exposure to acid, the polymer of FIG. 2 cleaves to form a benzylic cation that cannot directly eliminate to a vinyl group as can the polymer of FIG. 1. However, this benzylic cation may react with a nucleophile or an aromatic ring to release a proton, thereby continuing the catalytic cycle releasing low refractive index moieties. If this benzylic cation reacts with an aromatic ring attached to another polymer chain, the modified polymer will become crosslinked and the resulting hologram will be stabilized.

In the polymer of FIG. 2, y is preferably less than 0.5 and is desirably about 0.3.

Figure 3:
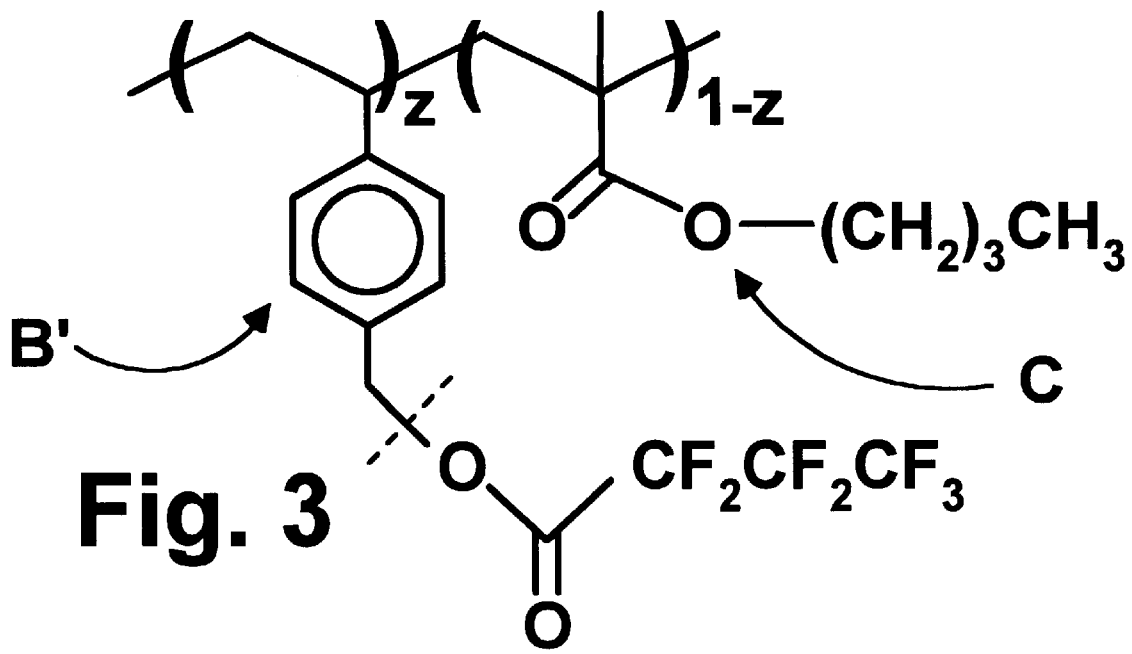

The polymer shown in FIG. 3 has the same side chain B' as that shown in FIG. 2, but the naphthyl side chain A present in the polymers of FIGS. 1 and 2 is replaced by a side chain (generally designated C) comprising an ester linking group and a butyl group attached to the ester linking group. This butyl group serves to lower the glass transition temperature ($T_g$) of the polymer and thus makes it easier to form the thin films of the polymer required for hologram formation. Thus, the polymer shown in FIG. 3 has one low refractive index moiety (the perfluoropropyl group of side chain B') and one high refractive index group (the tolyl group of side chain B'). Upon treatment of the FIG. 3 polymer with acid, as indicated by the broken line in FIG. 3, only the ester linkage of side chain B' cleaves and the low refractive index perfluoropropyl moiety is lost.

The FIG. 3 polymer also differs from the FIG. 1 and FIG. 2 polymers in that its main chain is methyl-substituted on the carbon atoms bearing side chains C. In the FIG. 3 polymer, z is preferably about 0.5.

Figure 4:
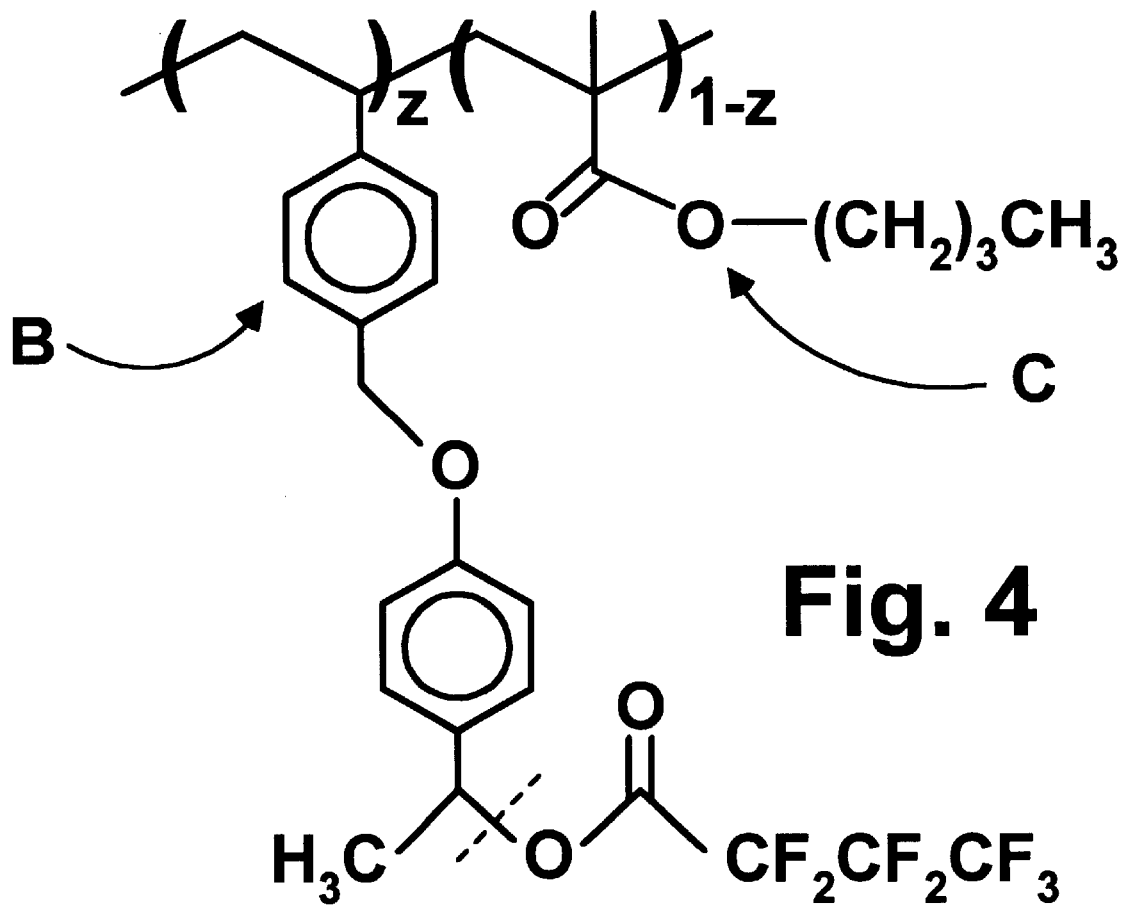

The FIG. 4 polymer is effectively a hybrid of the FIG. 1 and FIG. 3 polymers having the side chain C and methyl-substituted main chain of the FIG. 3 polymer and the side chain B of the FIG. 1 polymer. Thus, this polymer has a relatively low $T_g$, and upon cleavages produces vinyl groups which can be polymerized to stabilize the hologram in the same way as in the FIG. 1 polymer described above.

Figure 5:
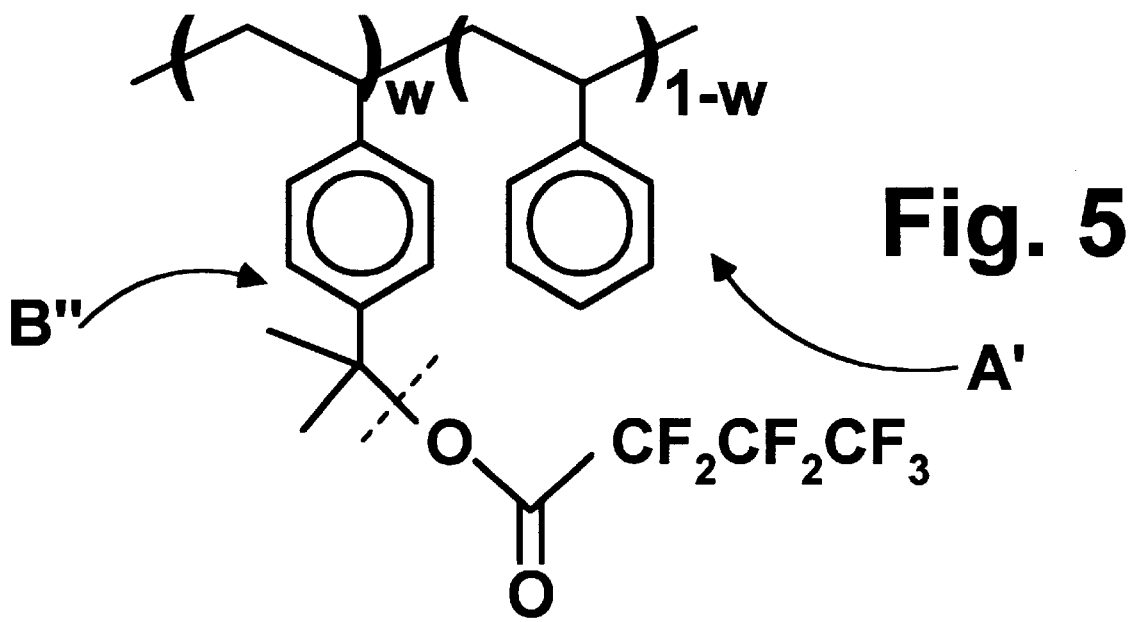

The FIG. 5 polymer is in effect a modified version of the FIG. 2 polymer with the naphthyl side chain A replaced with a phenyl side chain (designated A') and the side chain B' of the FIG. 2 polymer further modified by the substitution of two methyl groups on the carbon atom adjacent to the phenyl group to give a side chain designated B". Obviously, on exposure to acid, the FIG. 5 polymer will lose perfluorobutyric acid to produce methylvinyl groups attached to the benzene ring of side chain B", thereby enabling the hologram to be stabilized by cross-linking in the same way as already described for the FIG. 1 and FIG. 4 polymers.

In the FIG. 5 polymer, w is preferably less than 0.5 and is desirably about 0.4.

Figure 6:
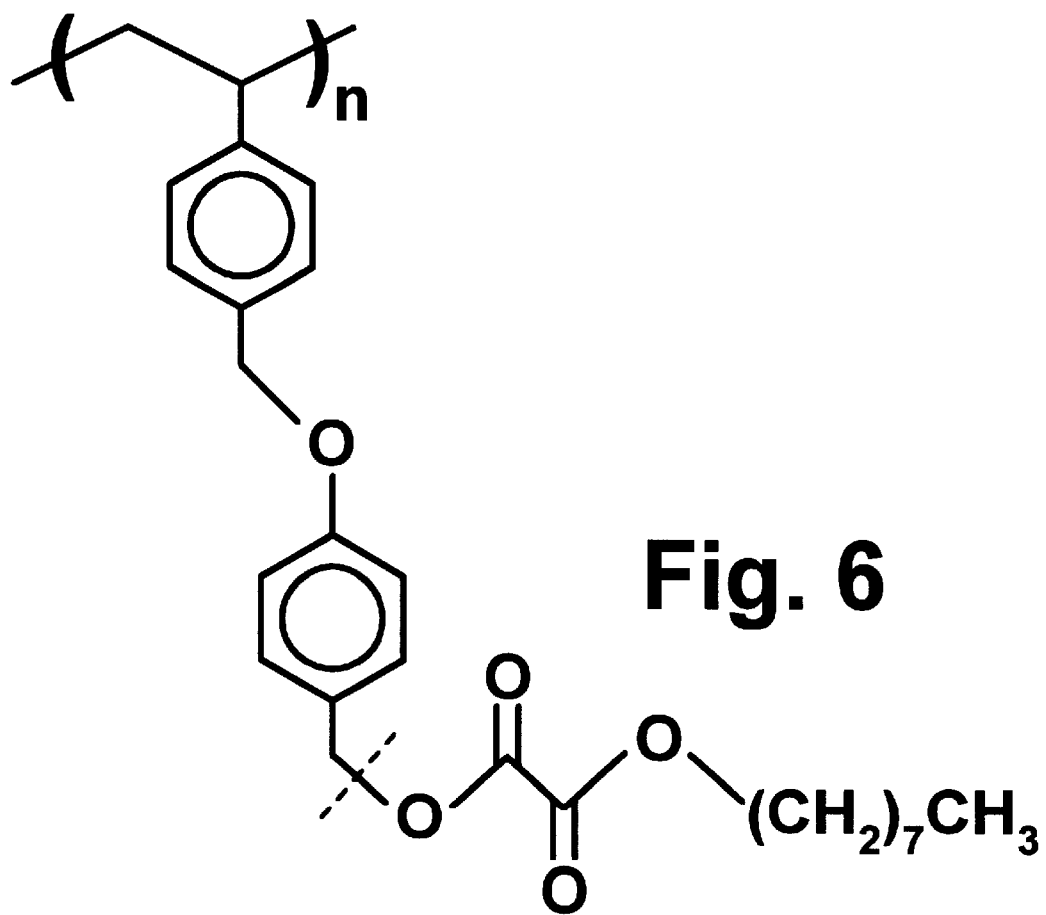

The FIG. 6 polymer differs from those previously discussed in that it has only one type of side chain. This side chain comprises, in sequence outward from the main chain (a) a 4-((4-methylphenoxy)methyl)phenyl group, which serves as the high refractive index moiety; (b) an oxalate (—O—C(=O)—C(=O)—O—) linking group attached to the group (a); and (c) an octyl group attached to the outboard end of the oxalate linking group and serving as the low refractive index moiety of the polymer. Upon treatment of this polymer with a strong acid, the polymer is cleaved at the point indicated by the broken line in FIG. 6 and the octyl low refractive index moiety is lost, while the high refractive index moiety remains attached to the main chain.

Figure 7:
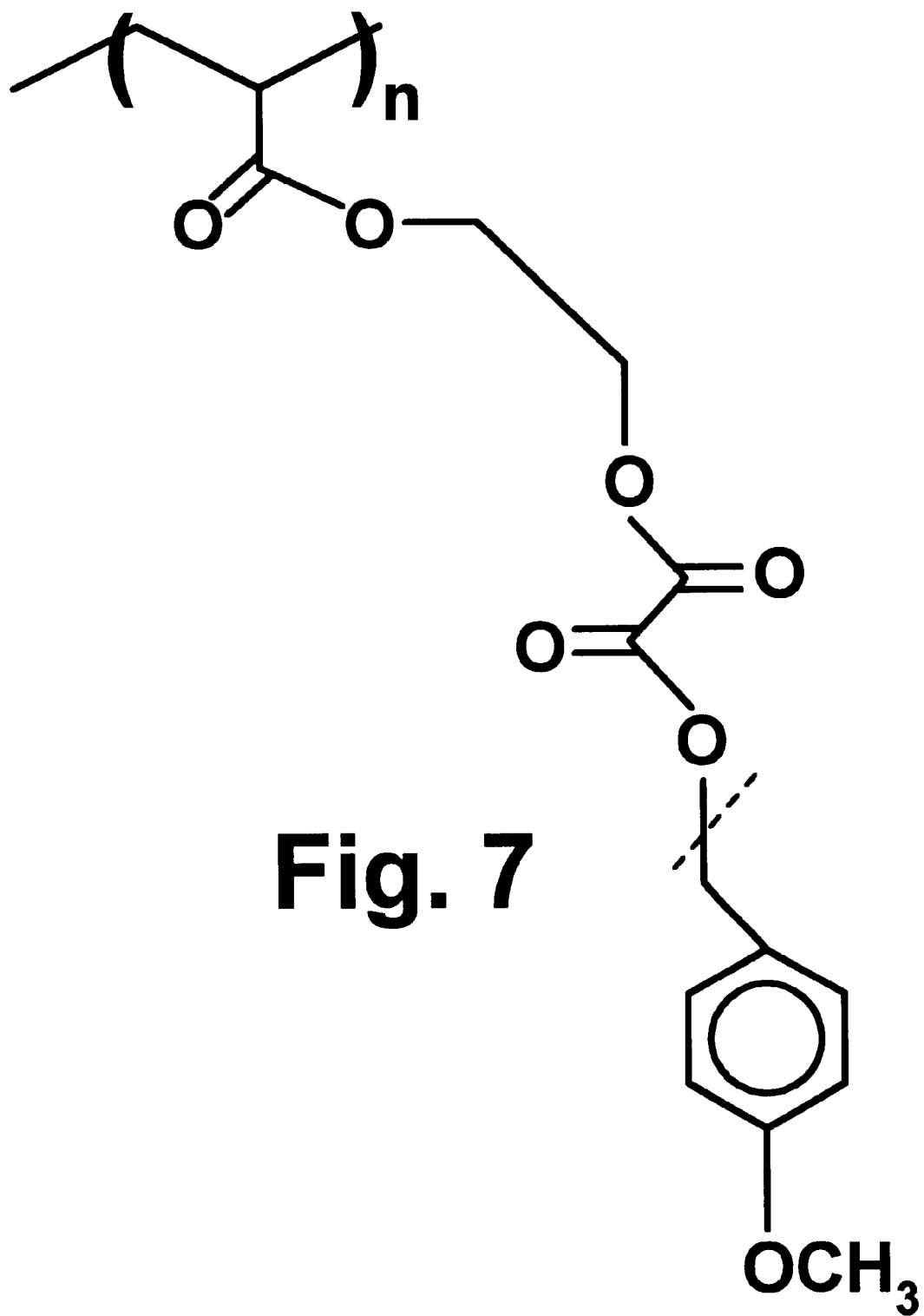

The polymer shown in FIG. 7 also only has a single type of side chain, which comprises (a) an ester linkage and a dimethylene group which together form a low refractive index moiety (the polymethylene main chain of the polymer also acts as a low refractive index moiety); (b) an oxalate linking group attached to the group (a); and (c) a 4-methoxybenzyl group attached to the outboard end of the oxalate linking group and serving as the high refractive index moiety of the polymer. This polymer cleaves at the point indicated by the broken line in FIG. 7, with loss of the high refractive index moiety and formation of a polymer of reduced refractive index.

Figure 8:
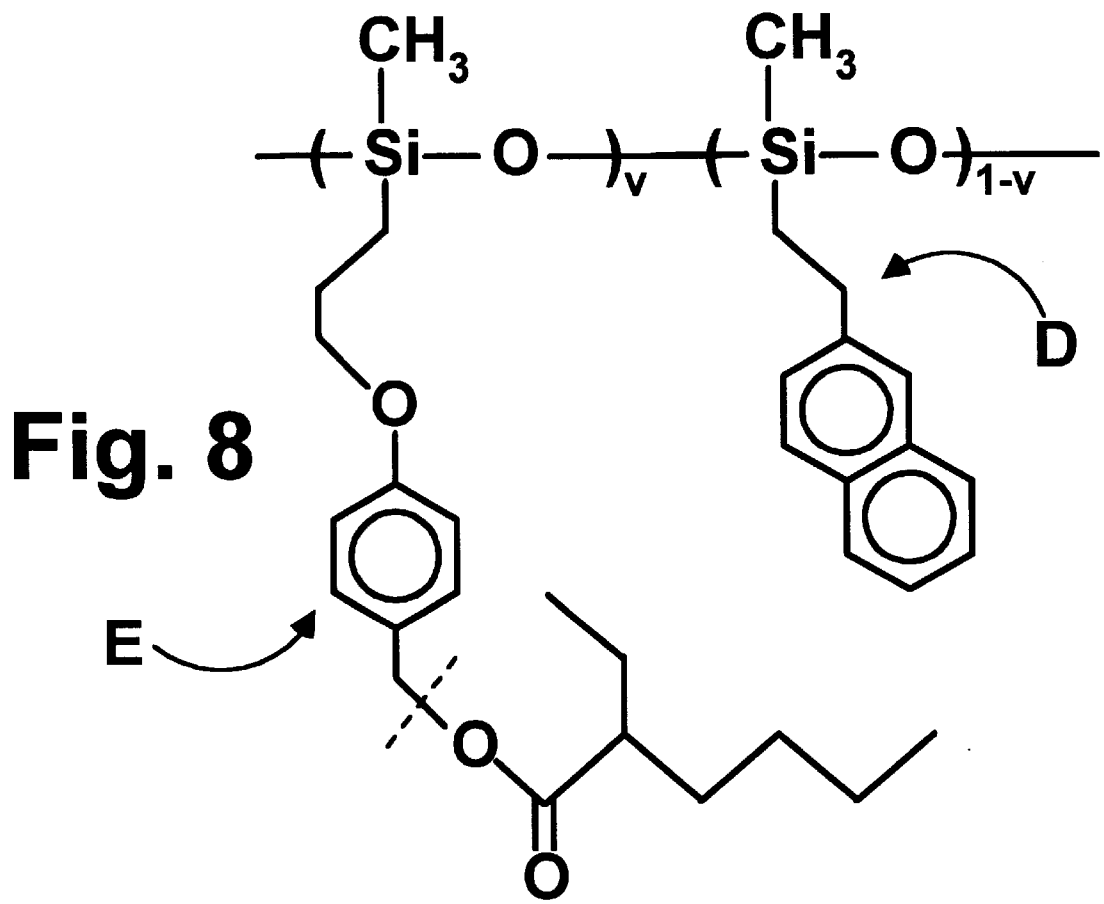
Figure 9:
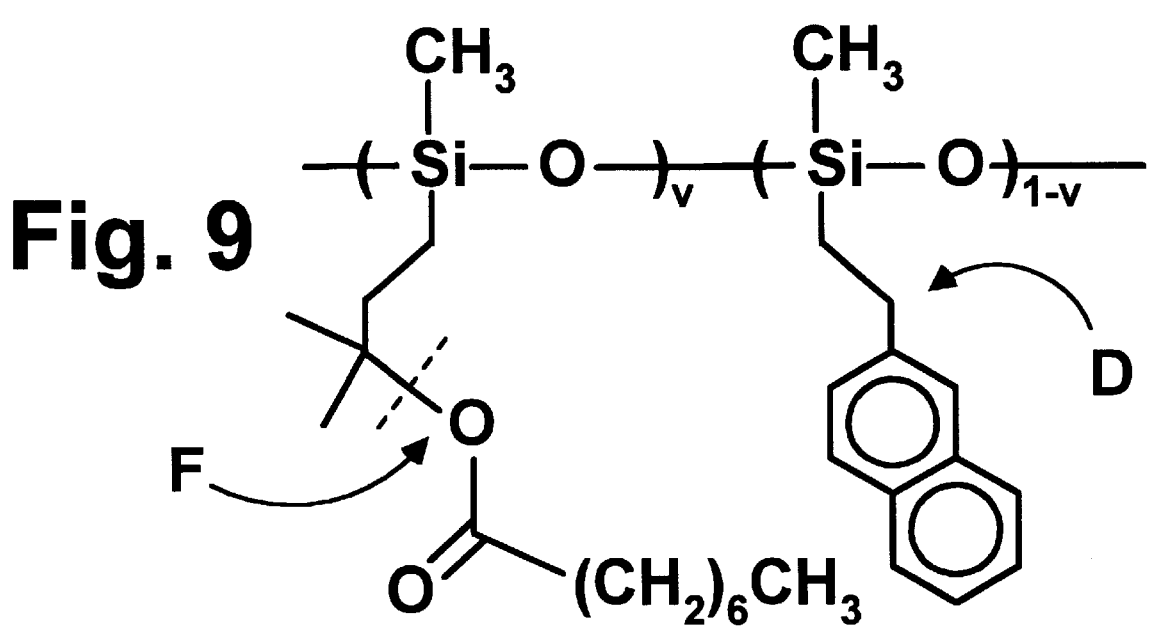

FIGS. 8 and 9 of the accompanying drawings illustrate preferred polymers having polysiloxane main chains. The polymer shown in FIG. 8 has a first side chain D which comprises a 2-naphthylethyl group, which serves as the high refractive index moiety of the polymer, and a second side chain E. This second side chain E comprises, in sequence outward from the main chain (a) a 3-(p-tolyloxy)-propyl group; (b) an ester linking group attached to the p-methyl carbon atom of the tolyloxy group; and (c) a 1-ethylpentyl group attached to the carbonyl group of the ester linking group and serving as the low refractive index moiety of the polymer. As will be apparent from the discussions of the other polymers discussed above with reference to FIGS. 1–6, upon exposure of the FIG. 7 polymer to acid, side chain D is unaffected, but the ester linkage in side chain E is cleaved, resulting in loss of the 1-ethylpentyl group, probably as the ethylhexanoic acid.

The polymer shown in FIG. 9 has the same polysiloxane main chain and first side chain D as the FIG. 8 polymer. However, in the FIG. 9 polymer, the second side chain F comprises (a) a 3,3-dimethylpropyl group; (b) an ester linking group attached to the 3-carbon atom of the propyl group; and (c) a heptyl group attached to the carbonyl group of the ester linking group and serving as the low refractive index moiety of the polymer. Upon exposure of the FIG. 9 polymer to acid, the ester linkage in side chain F is cleaved, with loss of octanoic acid, and formation of a positive charge on the 3-carbon atom of the propyl group. The resultant carbocation is unstable, and loses a proton, thereby converting side chain F to a 3-methylbut-1-enyl group, in the same manner as previously discussed for the FIG. 1 and FIG. 4 polymers.

The polymers shown in FIGS. 1–9 can readily be synthesized by conventional methods well known to skilled polymer chemists. The polymers of FIGS. 1–5 are prepared by reacting the corresponding "hydroxy functional" polymers (i.e., the corresponding polymers in which the perfluorobutanoic acid moiety is replaced by a hydroxyl group) with perfluorobutanoic anhydride. The hydroxy functional polymers themselves are prepared by copolymerizing the corresponding hydroxy functional styrene derivative with styrene (FIG. 5 polymer), 2-vinylnaphthalene (FIGS. 1 and 2 polymers) or butyl methacrylate (FIGS. 3 and 4 polymers). As already mentioned, the polysiloxanes of FIGS. 8 and 9 can be synthesized by hydrosilylating the corresponding poly(methylhydrosiloxane) with a mixture of the monomers needed to form the side chains, preferably using a Pt(0) catalyst.

The following Examples are now given, though by way of illustration only, to show details of particularly preferred components, conditions and techniques used in the media and processes of the present invention.

EXAMPLE 1

Polymers with Polymethylene Main Chains

The polymers shown in FIGS. 1–7 were separately dissolved in tetrahydrofuran (THF), together with from 3 to 5 percent of diphenyliodonium hexafluoroantimonate (a photoacid generator) and 1.5 to 2 percent of 9,10-bis (phenylethynyl)anthracene sensitizer (the stated percentages are by weight, based upon the weight of the polymer). The concentration of the polymer in the THF was 5 to 10 percent w/v. To provide controls, similar THF solutions were prepared containing polystyrene (with the acid generator and sensitizer) and with the FIG. 2 and FIG. 4 polymers (without the acid generator and sensitizer).

The resultant THF solutions were coated under red light on to clean glass slides and dried to give films having thicknesses of from 2 to 20 $\mu$m; in some cases, multiple coatings were necessary to give a film of the proper thickness. (The red light was required since the combination of acid generator and sensitizer used is not sensitive to red light but is sensitive to other visible wavelengths.) After coating, the slides were either kept at 65° C. briefly or dried overnight in a nitrogen purged storage box to remove any residual THF. Thereafter, the slides were kept in the dark until their holographic exposure.

Holographic exposure was effected by exposing the coated slides to interference fringes formed between two coherent beams from a blue, 476 nm argon laser at a power density of approximately 1 mW cm$^{-2}$. To enable the formation of a hologram to be monitored, a 633 nm beam from a helium/neon laser was passed at the Bragg angle through the exposed section of the film, and the first order diffraction of this beam was monitored. The exposure period of from 1 to 5 minutes necessary for formation of a hologram is indicated in Table 1 below. In the cases of polymers having glass transition temperatures substantially above ambient temperature, brief baking at 70° C. was necessary after exposure for observation of the hologram pattern, and Table 1 indicates in each case whether such baking was required.

TABLE 1

| Polymer of FIG. | Acid generator, % | Sensitizer, % | Exposure time, min. | Baked |
|---|---|---|---|---|
| 1 | 5 | 2 | 4 | Yes |
| 1 | 3 | 1.5 | 5 | Yes |
| 2 | 4 | 2 | 5 | Yes |
| 3 | 5 | 2 | 5 | No |
| 3 | 4 | 2 | 5 | No |
| 4 | 5 | 1.5 | 2 | No |
| 5 | 4 | 1.5 | 3 | Yes |
| 6 | 5 | 2 | 2 | No |
| 7 | 5 | 2 | 1 | No |

All of the polymers displayed increased holographic efficiency with increase in the thickness of the film. None of the control films showed any indication of hologram formation after 5 minutes exposure and post exposure baking.

From the data in Table 1, it will be seen that all of the polymers of FIGS. 1 to 7 displayed hologram formation under acceptable conditions.

EXAMPLE 2

Polymers with Polysiloxane Main Chains

The polymers shown in FIGS. 8 and 9 were separately dissolved in dichloromethane, together with 4 or 5 percent of diphenyliodonium hexafluoroantimonate (a photoacid generator) and 0.2 percent of 5,12-bis(phenylethynyl) naphthacene sensitizer (the stated percentages are by weight, based upon the weight of the polymer). The concentration of the polymer in the dichloromethane was 50 percent w/v. The solution was then flushed with a gentle stream of argon to remove the dichloromethane. The exact compositions used are shown in Table 2 below.

The resultant polymer samples were placed between two glass plates separated by a 50 μm polytetrafluoroethylene spacer, this operation being conducted under red light. (The red light was required since the combination of acid generator and sensitizer used is not sensitive to red light but is sensitive to other visible wavelengths.) Thereafter, the plates were kept in the dark until their holographic exposure.

Holographic exposure was effected by exposing the coated plates to interference fringes formed between two coherent beams from a green, 514 nm argon ion laser at a power density of 9.3 mW/cm². To enable the formation of a hologram to be monitored, a 633 nm beam from a helium/neon laser was passed at the Bragg angle through the exposed section of the film, and the first order diffraction of this beam was monitored. As indicated in Table 2 below, formation of a hologram was evident after 10 seconds exposure, and the holographic efficiency increased with sure time; no heating of the films was needed to produce observable holograms.

TABLE 2

| Polymer of FIG. | Acid generator, % | Sensitizer, % | Exposure time, sec. |
|---|---|---|---|
| 8 | 4 | 0.2 | 10 |
| 9 | 5 | 0.2 | 10 |

From these experiments, it will be seen that the siloxane polymers of FIGS. 8 and 9 produced holograms under acceptable conditions.

What is claimed is:

1. A process for preparing a volume hologram, which process comprises:
   providing a holographic recording medium comprising (a) an acid generator capable of generating an acid upon exposure to actinic radiation; and (b) a polymer, the polymer comprising a plurality of high refractive index moieties, a plurality of low refractive index moieties, and a plurality of acid-sensitive linking groups connecting the high refractive index moieties and the low refractive index moieties, the acid-sensitive linking groups being cleaved by the acid generated by the acid generator; and
   passing into the holographic recording medium a reference beam of coherent actinic radiation to which the acid generator is sensitive and an object beam of the same coherent actinic radiation, thereby forming within the holographic recording medium an interference pattern and, in the light fringe areas of the interference pattern, causing generation of acid by the acid generator and cleavage of the acid-sensitive linking groups by the acid, thereby causing separation of either the high refractive index moieties or the low refractive index moieties from the polymer, and formation of a volume hologram within the medium; and Wherein the polymer is selected from one of the following formulae:

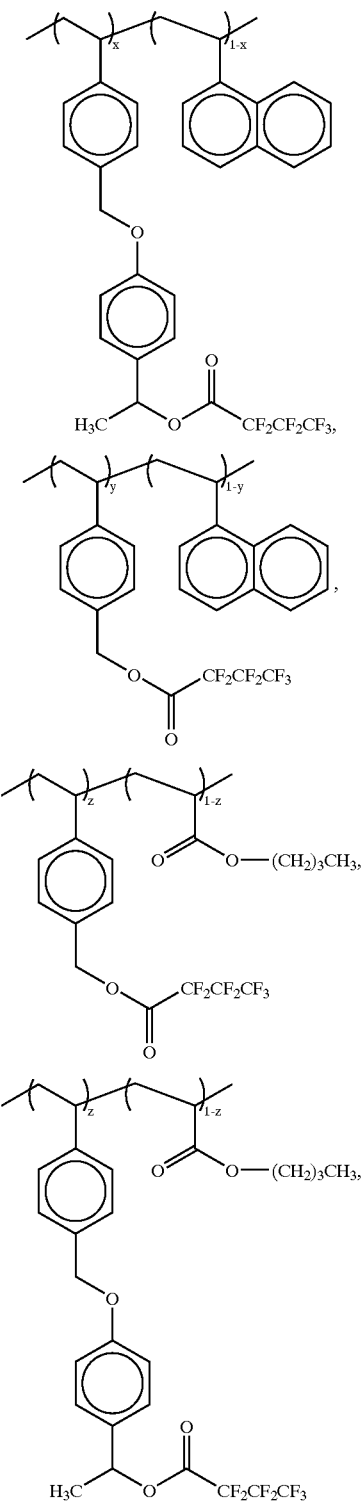

-continued

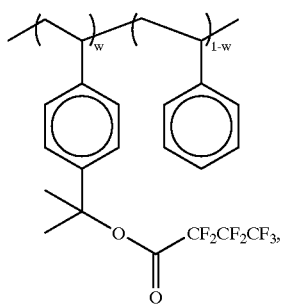

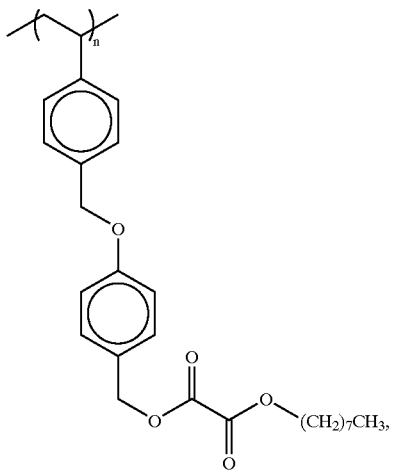

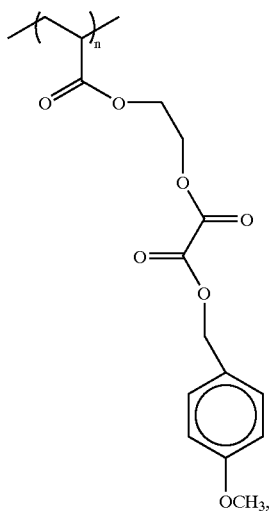

-continued

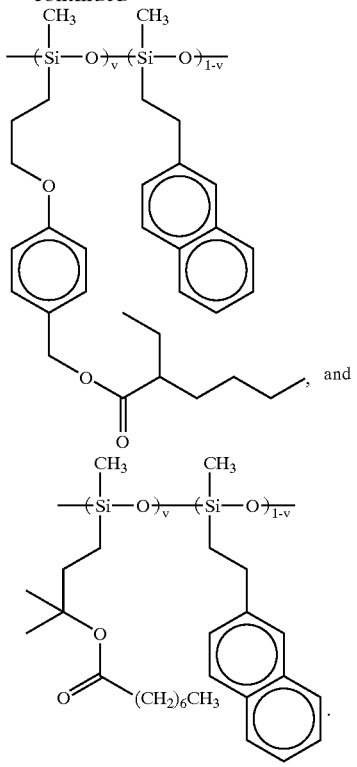

2. A process for preparing a hologram, which process comprises:

providing a holographic recording medium comprising (a) an acid generator capable of generating an acid upon exposure to actinic radiation; and (b) a polymer, this polymer comprising a plurality of high refractive index moieties, a plurality of low refractive index moieties, at least one of said low refractive index moieties comprising a perfluoroalkyl group, and a plurality of acid-sensitive linking groups connecting the high and low refractive index moieties, the acid-sensitive linking group being capable of being cleaved by the acid generated by the acid generator; and passing into the medium a reference beam of coherent actinic radiation to which the acid generator is sensitive and an object beam of the same coherent actinic radiation, thereby forming within the medium an interference pattern and, in the light areas of this interference pattern, causing generation of acid by the acid generator and cleavage of the acid-sensitive linking groups by this acid, thereby causing separation of either the high or the low refractive index moieties from the polymer, and formation of a hologram within the medium.

* * * * *